United States Patent
Tanimoto

(10) Patent No.: US 11,114,305 B2
(45) Date of Patent: Sep. 7, 2021

(54) ETCHING METHOD AND SEMICONDUCTOR MANUFACTURING METHOD

(71) Applicant: SHOWA DENKO K.K., Tokyo (JP)

(72) Inventor: Yosuke Tanimoto, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/756,914

(22) PCT Filed: Oct. 22, 2018

(86) PCT No.: PCT/JP2018/039220
§ 371 (c)(1),
(2) Date: Apr. 17, 2020

(87) PCT Pub. No.: WO2019/087850
PCT Pub. Date: May 9, 2019

(65) Prior Publication Data
US 2021/0217627 A1    Jul. 15, 2021

(30) Foreign Application Priority Data
Nov. 2, 2017    (JP) .............................. JP2017-212871

(51) Int. Cl.
*H01L 21/311*    (2006.01)
*H01L 21/3065*    (2006.01)
(Continued)

(52) U.S. Cl.
CPC .... *H01L 21/31116* (2013.01); *H01L 21/3065* (2013.01); *H01L 27/11556* (2013.01); *H01L 27/11582* (2013.01)

(58) Field of Classification Search
CPC .......... H01L 21/31116; H01L 21/3065; H01L 27/11556; H01L 27/11582
See application file for complete search history.

(56) References Cited

U.S. PATENT DOCUMENTS

| | | | | |
|---|---|---|---|---|
| 6,660,643 B1* | 12/2003 | Kardauskas | ........ | H01L 21/3065 438/706 |
| 2010/0009542 A1* | 1/2010 | Honda | ................ | H01L 21/0337 438/702 |

(Continued)

FOREIGN PATENT DOCUMENTS

| JP | 05-152255 A | 6/1993 |
|---|---|---|
| JP | 2011-176293 A | 9/2011 |

(Continued)

OTHER PUBLICATIONS

International Preliminary Report on Patentability with the translation of Written Opinion dated May 5, 2020, form the International Bureau in International Application No. PCT/JP2018/039220.

(Continued)

*Primary Examiner* — Anita K Alanko
(74) *Attorney, Agent, or Firm* — Sughrue Mion, PLLC

(57) ABSTRACT

An etching method which includes treating a workpiece having a stacked film (5) of a silicon oxide layer (2) and a silicon nitride layer (3) with an etching gas containing an unsaturated halon represented by the chemical formula: $C_2H_xF_{(3-x)}Br$ (in the chemical formula, x stands for 0, 1, or 2) so as to control the respective etch rates of the silicon nitride layer and the silicon oxide layer to the same level and form a high-aspect-ratio hole having a desirable profile at a high etch rate. Also disclosed is a method of manufacturing a semiconductor which includes by carrying out the etching method.

11 Claims, 3 Drawing Sheets

(51) Int. Cl.
    *H01L 27/11582*    (2017.01)
    *H01L 27/11556*    (2017.01)

(56) References Cited

U.S. PATENT DOCUMENTS

2011/0183445 A1    7/2011    Hanaoka et al.
2012/0034785 A1    2/2012    Hayashi et al.
2015/0357200 A1    12/2015   Inui
2017/0162399 A1    6/2017    Takayama et al.
2018/0204728 A1    7/2018    Oomori et al.

FOREIGN PATENT DOCUMENTS

| JP | 2012-038864 A | 2/2012 |
| JP | 2013-070098 A | 4/2013 |
| JP | 2017-050529 A | 3/2017 |
| JP | 2017-103388 A | 6/2017 |
| TW | 201213279 A1 | 4/2012 |
| WO | 2011/162278 A1 | 12/2011 |

OTHER PUBLICATIONS

International Search Report of PCT/JP2018/039220 dated Jan. 15, 2019 [PCT/ISA/210].
Communication dated Dec. 7, 2020, from the European Patent Office in corresponding European Application No. 18872684.8.

* cited by examiner

ETCHING METHOD AND SEMICONDUCTOR MANUFACTURING METHOD

CROSS REFERENCE TO RELATED APPLICATIONS

This application is a National Stage of International Application No. PCT/JP2018/039220, filed Oct. 22, 2018, claiming priority to Japanese Patent Application No. 2017-212871, filed Nov. 2, 2017.

TECHNICAL FIELD

The present invention relates to an etching method and a method of manufacturing a semiconductor.

BACKGROUND ART

Semiconductor manufacturing steps include a step of etching a stacked film having a silicon oxide layer and a silicon nitride layer by using an etching gas with a resist, an organic film, or a carbon film as a mask and thereby forming a hole (through-hole) such as a contact hole. During such hole formation, there may easily occur necking, that is, deformation of an inlet portion of the hole to have an occluded profile or bowing, that is, deformation of the intermediate portion, in the lengthwise direction, of the hole to a barrel-shaped profile.

Since a Si—N bond is weaker than a Si—O bond in bonding energy, an etch rate of the silicon nitride layer tends to become larger than that of the silicon oxide layer. When the above-described stacked film is subjected to deep etching to form a hole having a high aspect ratio, an etch rate of the silicon nitride layer in the plane direction orthogonal to the thickness direction becomes larger than an etch rate of the silicon oxide layer in the thickness direction and the silicon nitride layer is excessively etched in the plane direction. This may lead to formation of an abnormal etching profile.

Further, in a high-aspect-ratio hole, difficulty in delivery of an etching gas to the deep portion tends to cause a reduction in etch rate.

Particularly in recent years, miniaturization of semiconductor devices tends to decrease the diameter of contact holes and increase the aspect ratio of them.

There is therefore a demand for a technology capable of forming a small-diameter and high-aspect-ratio contact hole having a desirable profile, that is, a substantially vertical one with less necking and bowing without reducing an etch rate.

For example, PTL 1 discloses a method of etching the above-described stacked film while controlling the respective etch rates of the silicon nitride layer and the silicon oxide layer to be the same level by using an etching gas composed of 1,3,3,3-tetrafluoropropene ($CF_3CHCHF$), an unsaturated perfluorocarbon having from 2 to 5 carbon atoms, an oxidizing gas, and an inert gas.

PTL 2 describes that by using a gas having a halogen element with a large atomic number, carbon, and fluorine, such as bromotrifluoromethane ($CF_3Br$) as an etching gas, plasma made from the anisotropic etching gas is caused to reach the bottom of a hole.

PTL 3 describes an etching method using a gas, such as 1-bromo-3,3,3-trifluoropropyne ($CF_3CCBr$), having a halogen element with a large atomic number, carbon, fluorine, and a triple bond as an etching gas.

PTL 4 describes a method of using bromotrifluoroethylene ($CBrFCF_2$) for etching of a silicon oxide film. There is however no report on the use of bromotrifluoroethylene for etching of a silicon nitride film.

CITATION LIST

Patent Literatures

PTL 1: JP 2017-50529 A
PTL 2: JP 2013-70098 A
PTL 3: JP 2011-176293 A
PTL 4: JP 1993-152255 A

SUMMARY OF INVENTION

Technical Problem

The above-described related art has however a problem that when a small-diameter and high-aspect-ratio contact hole is formed, a reduction in etch rate occurs at the deep portion of the contact hole. In addition, due to a weak deposition effect, it has a problem that bowing, that is, deformation of the intermediate portion, in the lengthwise direction, of the hole into a barrel-shaped profile easily occurs. Further, it has a problem that a fluorinated propyne having less carbon atoms has low stability and is hard to handle.

An object of the present invention is to provide an etching method and a semiconductor manufacturing method capable of controlling the respective etch rates of a silicon nitride layer and a silicon oxide layer to be the same level and capable of obtaining even a high-aspect-ratio hole having a desirable profile at a high etch rate.

Solution to Problem

Each aspect of the present invention for achieving the above-described object is as described below in [1] to [5].

[1] An etching method including treating a workpiece having a stacked film of a silicon oxide layer and a silicon nitride layer with an etching gas containing an unsaturated halon represented by the following chemical formula: $C_2H_xF_{(3-x)}Br$ (in the chemical formula, x stands for 0, 1, or 2) to etch both the silicon oxide layer and the silicon nitride layer.

[2] The etching method as described above in [1], wherein the unsaturated halon is at least one selected from the group consisting of bromotrifluoroethylene, (E)-1-bromo-2-fluoroethylene, and 1-bromo-1-fluoroethylene.

[3] The etching method as described above in [1] or [2], wherein the etching gas further contains an inert gas.

[4] The etching method as described above in any one of [1] to [3], wherein in the etching step, etching is performed with a plasma gas made from the etching gas.

[5] A method of manufacturing a semiconductor including performing etching by the etching method as described above in any one of [1] to [4].

Advantageous Effects of Invention

By etching a workpiece having a stacked film of a silicon oxide layer and a silicon nitride layer by the etching method and the semiconductor manufacturing method according to the present invention, the respective etch rates of the silicon nitride layer and the silicon oxide layer can be controlled to the same level and even a high-aspect-ratio hole having a desirable profile can be formed at a high etch rate.

DESCRIPTION OF EMBODIMENTS

Figure 1:
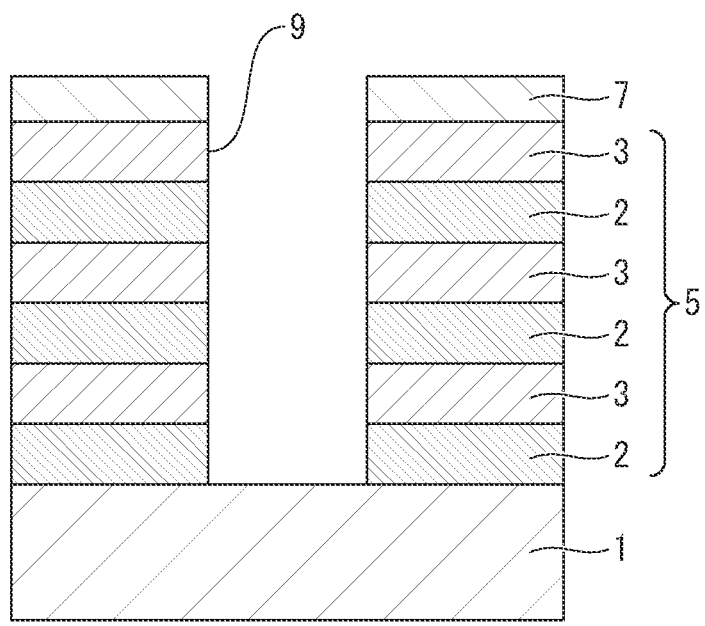
FIG. 1 is a cross-sectional view of a workpiece illustrative of the etching method according to one embodiment of the present invention.

Embodiments of the present invention will now be described. The present embodiment shows one example of the present invention and it does not limit the present invention. Further, various changes or improvements can be added to the present embodiment and the present invention may also embrace the embodiment including such a change or improvement.

The etching method of the present embodiment includes treating a workpiece having a stacked film of a silicon oxide layer (SiOy layer) and a silicon nitride layer with an etching gas containing an unsaturated halon represented by the following chemical formula: $C_2H_xF_{(3-x)}Br$ (in the chemical formula, x stands for 0, 1, or 2) to etch both the silicon oxide layer and the silicon nitride layer.

By etching a workpiece having a stacked film of a silicon oxide layer and a silicon nitride layer by the etching method of the present embodiment, a ratio of an etch rate of the silicon nitride layer to an etch rate of the silicon oxide layer ([etch rate of silicon nitride layer]/[etch rate of silicon oxide layer]) can be controlled freely to between 0.8 or more and less than 1.5 with etching conditions and the like. The etching method of the present embodiment therefore makes it possible to control the respective etch rates of the silicon nitride layer and the silicon oxide layer to be the same level. The ratio of an etch rate of the silicon nitride layer to an etch rate of the silicon oxide layer is controlled preferably to between 0.9 or more and less than 1.2.

The etching method of the present embodiment also makes it possible to form even a high-aspect-ratio hole having a desirable profile at a high etch rate due to a deposition effect described next.

Described specifically, an unsaturated halon represented by the chemical formula: $C_2H_xF_{(3-x)}Br$ has a double bond in its molecule and it polymerizes into a polymer in plasma. The polymer thus formed is deposited on the side wall of a hole (through-hole) such as contact hole and forms a protective film. This deposition effect suppresses isotropic etching and therefore, a hole having a desirable profile, more specifically, a substantially vertical profile with less necking and bowing can be formed.

The unsaturated halon represented by the chemical formula: $C_2H_xF_{(3-x)}Br$ has, in its molecule, a bromine atom heavier than a fluorine atom and an etching gas easily reaches the deep portion of such a high-aspect-ratio hole. Even in a high-aspect-ratio hole, therefore, a reduction in etch rate is hard to occur and etching can be performed at a high etch rate.

Although the kind of the unsaturated halon represented by the chemical formula: $C_2H_xF_{(3-x)}Br$ is not particularly limited, at least one selected from the group consisting of bromotrifluoroethylene ($CBrFCF_2$), (E)-1-bromo-2-fluoroethylene (CHBrCHF), and 1-bromo-1-fluoroethylene ($CBrFCH_2$) can be used.

The etching gas may contain an inert gas in addition to the unsaturated halon represented by the chemical formula: $C_2H_xF_{(3-x)}Br$. By performing etching in the presence of an inert gas, the silicon oxide layer and the silicon nitride layer can be etched selectively and at a high etch rate, with respect to the mask. Although the kind of the inert gas is not particularly limited, examples include helium (He), argon (Ar), neon (Ne), krypton (Kr), xenon (Xe), and nitrogen ($N_2$). These inert gases may be used either singly or in combination of two or more. Of these inert gases, argon is preferred in view of handling ease. When the inert gas is incorporated to dilute the unsaturated halon, the following is an example of a dilution ratio in terms of a volume ratio: (the unsaturated halon) : (the inert gas)=from 1:99 to 80:20, preferably from 5:95 to 50:50, more preferably from 5:95 to 20:80.

Although the etching method used in the etching step is not particularly limited, a plasma etching method in which etching is performed with a plasma gas made from an etching gas can be used.

Examples of the plasma used for etching include capacitively coupled plasma (CCP), electron cyclotron resonance plasma (ECP), helicon wave plasma (HWP), inductively coupled plasma (ICP), and microwave excited surface wave plasma (SWP).

Such an etching method of the present embodiment can be used in a step of forming, in a stacked film obtained by alternately stacking many silicon nitride layers and silicon oxide layers on a substrate, a through-hole extending in its thickness direction, as one step during the manufacturing procedure of, for example, a 3D NAND flash memory.

One example of a method of etching a workpiece having a stacked film of a silicon oxide layer and a silicon nitride layer to form a through-hole in the stacked film by the etching method of the present embodiment will next be described referring to FIG. 1.

FIG. 1 is a cross-sectional view of a workpiece having a through-hole 9 in a stacked film 5. In this workpiece, the stacked film 5 obtained by alternately stacking many silicon nitride layers 3 and silicon oxide layers 2 (each, three layers in the example of FIG. 1) is provided on a semiconductor substrate 1. The semiconductor substrate 1 has one of the silicon oxide layers 2 of the stacked film 5 right above the substrate.

The top silicon nitride layer 3 of the stacked film 5 is covered, at the upper surface, with a mask 7 in which a pattern is formed. By carrying out etching by the etching method of the present embodiment, the stacked film 5 exposed from the mask 7 is etched to form a through-hole 9.

In the etching method of the present embodiment, the respective etch rates of the silicon nitride layer 3 and the silicon oxide layer 2 can be controlled to the same level. During formation of the through-hole 9 in the stacked film 5, therefore, excessive etching, in the plane direction (direction orthogonal to the thickness direction), of the silicon nitride layer 3 exposed from the inner surface of the through-hole 9 is suppressed. Even when the stacked film 5 is subjected to deep etching for forming a through-hole 9 having a high aspect ratio exceeding an aspect ratio of 20, the through-hole 9 thus obtained has, as illustrated in FIG. 1, neither collapse of a stack structure of the stacked film 5 nor an abnormal etching profile. In addition, even when the stacked film 5 is subjected to deep etching for forming a through-hole 9 having a high aspect ratio exceeding an aspect ratio of 20, the through-hole 9 thus obtained can have a desirable profile while keeping a high etch rate.

EXAMPLES

The present invention will hereinafter be described in further detail by Examples and Comparative Examples.

Example 1

Figure 2:
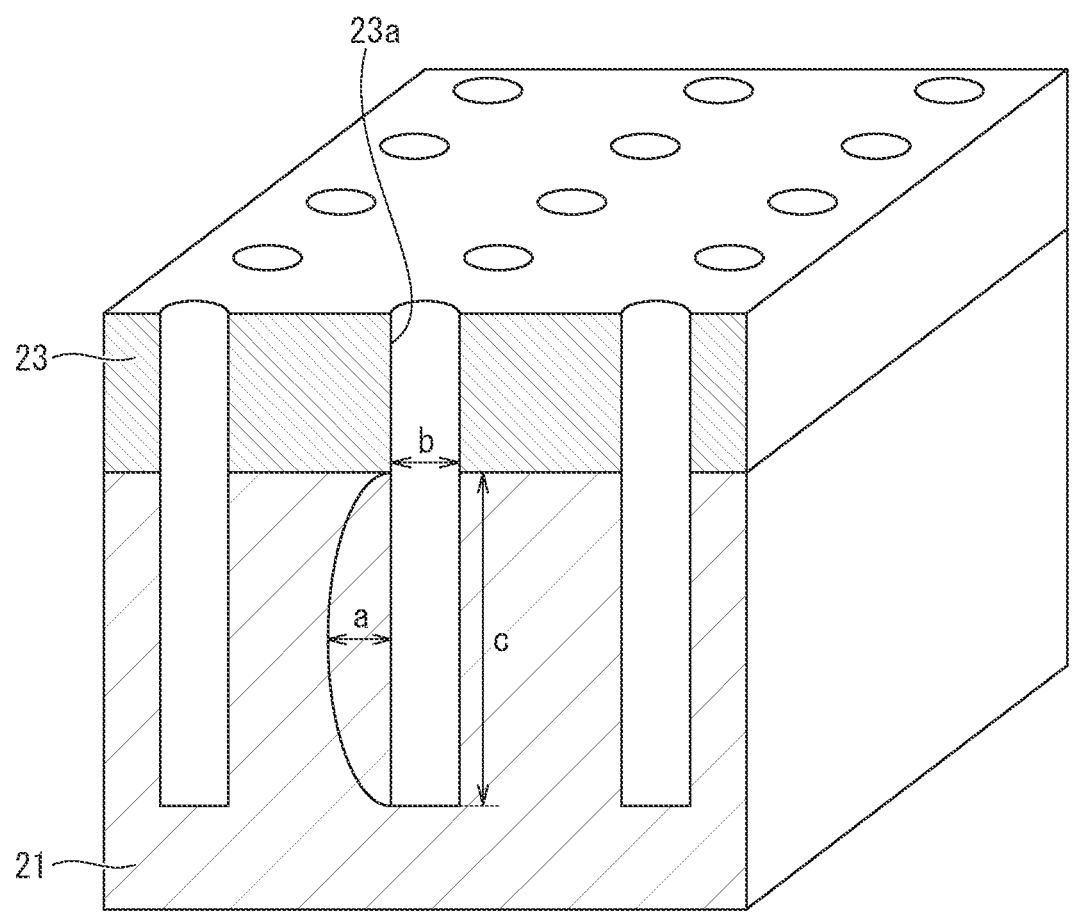
FIG. 2 is a schematic view illustrative of the structure of a test piece used in Examples and Comparative Examples.
Figure 3:
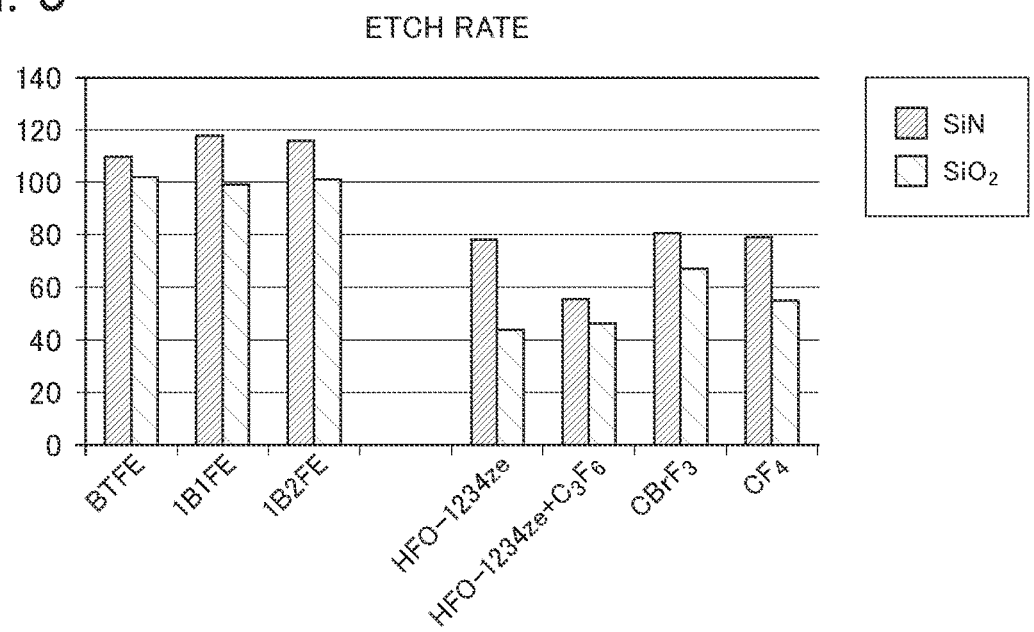
FIG. 3 is a graph illustrative of the measurement results of an etch rate.
Figure 4:
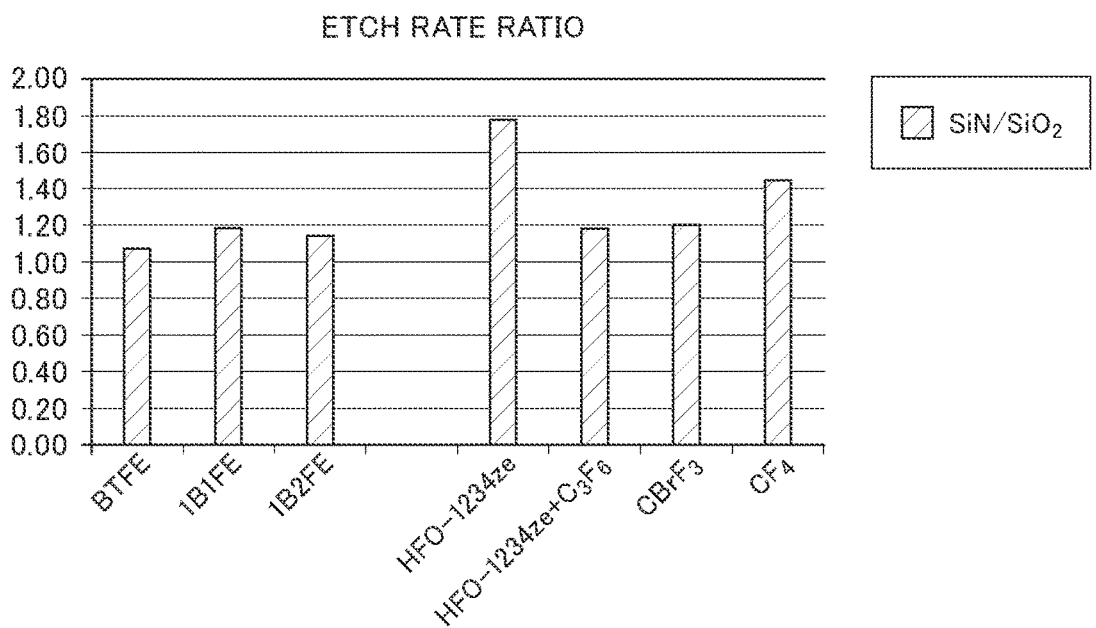
FIG. 4 is a graph illustrative of the measurement results of an etch rate ratio.
Figure 5:
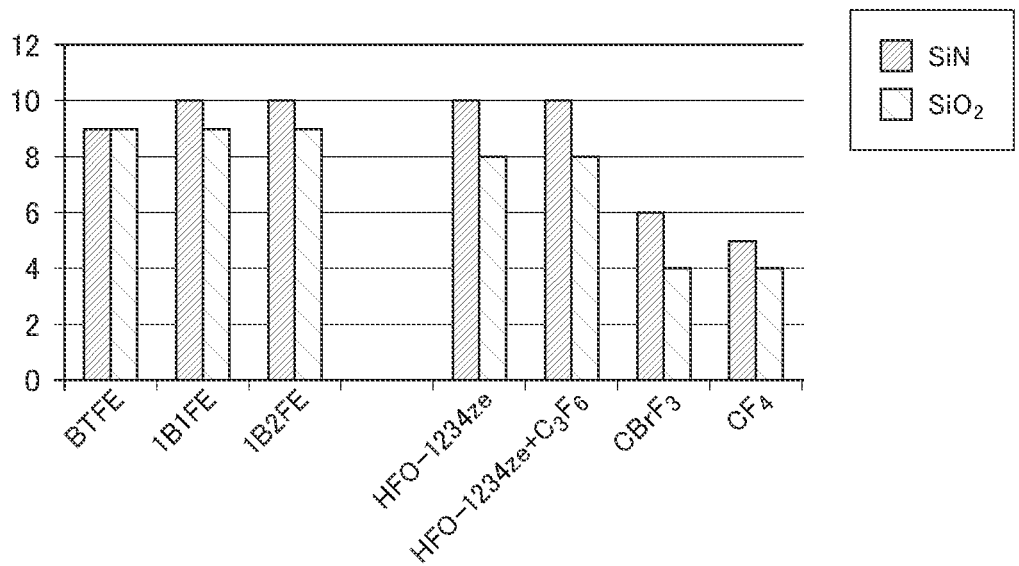
FIG. 5 is a graph illustrative of the measurement results of an aspect ratio.
Figure 6:
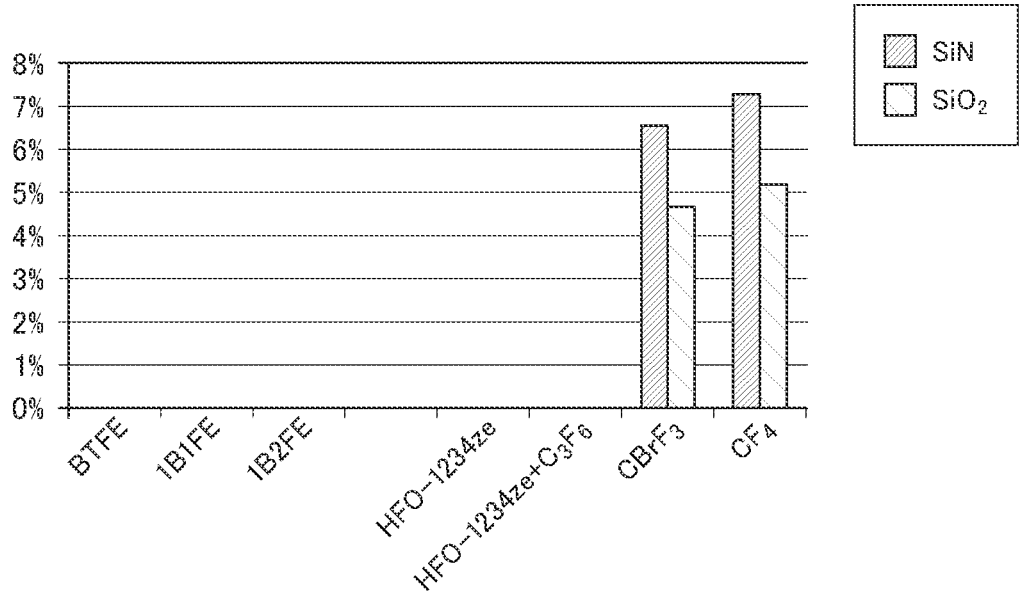
FIG. 6 is a graph illustrative of the measurement results of a side etch percentage.

A method of manufacturing a test piece of Example 1 will be described referring to FIG. 2. A silicon compound layer 21 made of silicon nitride was formed on an unillustrated Si substrate by plasma chemical vapor deposition. The silicon compound layer 21 was formed to have a film thickness of 2000 nm. Next, a photoresist dot pattern mask 23 was formed on the silicon compound layer 21 to obtain a test piece A. The dot pattern had, at its opening portion 23a, a diameter of from 50 nm to 200 nm and the photoresist dot pattern mask 23 had a film thickness of 1000 nm.

Next, in a manner similar to that described above except that a silicon compound layer 21 made of silicon oxide was formed on the Si substrate instead of the silicon compound layer 21 made of silicon nitride, a test piece B was obtained.

The test pieces A and B were subjected to inductively coupled plasma etching (ICP etching) to etch the silicon compound layer 21 (the silicon nitride layer or the silicon oxide layer) to make a hole. Etching conditions are as described below.

Etching apparatus: ICP etching apparatus RIE-200iP, product of Samco
Etching time: 10 minutes
ICP power: 500 W
Bias power: 200 W
Pressure: 2 Pa
Etching gas: a mixed gas of 1 part by volume of bromotrifluoroethylene (hereinafter be abbreviated as "BTFE") and 9 parts by volume of argon
Flow rate of etching gas: 100 SCCM After completion of the etching, the test pieces A and B were each cut along a plane extending in the stacking direction of the Si substrate, the silicon compound layer 21, and the photoresist dot pattern mask 23 and the cross-section of them was observed using a field emission scanning electron microscope (FE-SEM), product of JEOL Ltd. From the observation results, the respective etch rates of the silicon compound layers 21 (the silicon nitride layer and the silicon oxide layer), and the aspect ratio and the side etch percentage of the hole thus formed were measured.

The etch rate was calculated using a difference in film thickness of the silicon compound layer 21 between a portion covered with the photoresist dot pattern mask 23 and an opening portion 23a (meaning an etching depth c in FIG. 2) and an etching time. The aspect ratio of the hole is a c/b ratio, that is, a ratio of (etching depth c) to (diameter b of the opening portion 23a). The side etch percentage of the hole is an a/b ratio, that is, a ratio of (etched amount a of the side wall of the hole) to (diameter b of the opening portion 23a). The term "etched amount of the side wall of the hole a" means, when the side wall of the hole extending substantially vertically is etched and the intermediate portion, in the lengthwise direction, of the hole has a barrel-shaped profile as illustrated in FIG. 2, the length of the etched portion in the direction orthogonal to the lengthwise direction of the hole.

Example 2

In a manner similar to that of Example 1 except that as the unsaturated halon in the etching gas, 1-bromo-1-fluoroethylene (hereinafter be called "1B1FE") was used instead of BTFE, etching and microscopic observation were carried out and the respective etch rates of the silicon compound layers 21 (the silicon nitride layer and the silicon oxide layer) and the aspect ratio and the side etch percentage of the hole thus formed were measured.

Example 3

In a manner similar to that of Example 1 except that as the unsaturated halon in the etching gas, (E)-1-bromo-2-fluoroethylene (hereinafter be called "1B2FE") was used instead of BTFE, etching and microscopic observation were carried out and the respective etch rates of the silicon compound layers 21 (the silicon nitride layer and the silicon oxide layer) and the aspect ratio and the side etch percentage of the hole thus formed were measured.

Comparative Example 1

In a manner similar to that of Example 1 except that the etching gas was replaced by a mixed gas composed of 1 part by volume of (E)-1,3,3,3-tetrafluoropropene (hereinafter be called "HFO-1234ze"), 1 part by volume of an oxygen gas, and 8 parts by volume or argon, etching and microscopic observation were carried out and the respective etch rates of the silicon compound layers 21 (the silicon nitride layer and the silicon oxide layer) and the aspect ratio and the side etch percentage of the hole thus formed were measured.

Comparative Example 2

In a manner similar to that of Example 1 except that the etching gas was replaced by a mixed gas composed of 1 part by volume of HFO-1234ze, 0.5 part by volume of hexafluoropropene ($C_3F_6$), 0.6 part by volume of an oxygen gas, and 7.9 parts by volume or argon, etching and microscopic observation were carried out and the respective etch rates of the silicon compound layers 21 (the silicon nitride layer and the silicon oxide layer) and the aspect ratio and the side etch percentage of the hole thus formed were measured.

Comparative Example 3

In a manner similar to that of Example 1 except that the etching gas was replaced by bromotrifluoromethane ($CBrF_3$), etching and microscopic observation were carried out and the respective etch rates of the silicon compound layers 21 (the silicon nitride layer and the silicon oxide layer) and the aspect ratio and the side etch percentage of the hole thus formed were measured.

Comparative Example 4

In a manner similar to that of Example 1 except that the etching gas was replaced by carbon tetrafluoride ($CF_4$), etching and microscopic observation were carried out and the respective etch rates of the silicon compound layers 21 (the silicon nitride layer and the silicon oxide layer) and the aspect ratio and the side etch percentage of the hole thus formed were measured.

TABLE 1

| | Etching gas | | | | Etch rate (nm/min) | | Etch rate ratio | Aspect ratio | | Side etch percentage | |
| | Main gas | Additional gas | Oxidizing gas | Inert gas | Flow rate [1] (sccm) | SiN [2] | SiO$_2$ [3] | SiN/SiO$_2$ [2, 3] | SiN [2] | SiO$_2$ [3] | SiN [2] | SiO$_2$ [3] |
|---|---|---|---|---|---|---|---|---|---|---|---|---|
| Example 1 | BTFE | — | — | Ar | 10/-/-/90 | 110 | 102 | 1.08 | 9 | 9 | Less than 1% | Less than 1% |
| Example 2 | 1B1FE | — | — | Ar | 10/-/-/90 | 118 | 99 | 1.19 | 10 | 9 | Less than 1% | Less than 1% |
| Example 3 | 1B2FE | — | — | Ar | 10/-/-/90 | 116 | 101 | 1.15 | 10 | 9 | Less than 1% | Less than 1% |
| Comp. Ex. 1 | HFO-1234ze | — | O$_2$ | Ar | 10/-/10/80 | 78 | 44 | 1.78 | 10 | 8 | Less than 1% | Less than 1% |
| Comp. Ex. 2 | HFO-1234ze | C$_3$F$_6$ | O$_2$ | Ar | 10/5/6/79 | 55 | 46 | 1.19 | 10 | 8 | Less than 1% | Less than 1% |
| Comp. Ex. 3 | CBrF$_3$ | — | — | Ar | 10/-/-/90 | 81 | 67 | 1.20 | 6 | 4 | 7% | 5% |
| Comp. Ex. 4 | CF$_4$ | — | — | Ar | 10/-/-/90 | 79 | 55 | 1.45 | 5 | 4 | 7% | 5% |

[1] Flow rate = main gas/additional gas/oxidizing gas/inert gas
[2] Silicon nitride layer
[3] Silicon oxide layer Results of Examples 1 to 3 and Comparative Examples 1 to 4 are illustrated in Table 1 and the graphs of FIGS. 3 to 6. As is apparent from Table 1 and the graphs of FIGS. 3 to 6, in Examples 1 to 3 in which etching was performed using an etching gas containing an ethylene derivative having F and Br, compared with Comparative Examples 1 to 4, a high-aspect-ratio hole is formed at a high etch rate and at the same time, the hole has a low side etch percentage and therefore has a desirable profile. Further, in Examples 1 to 3, the respective etch rates of the silicon nitride layer and the silicon oxide layer are controlled to the same level.

In Comparative Example 1, the side etch percentage was low but the etch rate at the time of forming a high-aspect-ratio hole was not sufficient. In addition, there was a large difference in etch rate between the silicon nitride layer and the silicon oxide layer.

In Comparative Example 2, although the side etch percentage was low and, compared with Comparative Examples 1, the respective etch rates of the silicon nitride layer and the silicon oxide layer were controlled to the same level, the etch rate at the time of forming a high-aspect-ratio hole was not sufficient.

In Comparative Example 3, although the respective etch rates of the silicon nitride layer and the silicon oxide layer were controlled to the same level and the etch rate at the time of forming a high-aspect-ratio hole was on a good level, the side etch percentage was high.

In Comparative Example 4, there was a large difference in etch rate between the silicon nitride layer and the silicon oxide layer and in addition, the side etch percentage was high.

REFERENCE SIGNS LIST

1: Semiconductor substrate
2: Silicon oxide layer
3: Silicon nitride layer
5: Stacked film
7: Mask
9: Through-hole
21: Silicon compound layer
23: Photoresist dot pattern mask
23a: Opening portion

The invention claimed is:

1. An etching method, comprising treating a workpiece having a stacked film of a silicon oxide layer and a silicon nitride layer with an etching gas containing an unsaturated halon represented by the following chemical formula: $C_2H_xF_{(3-x)}Br$ (in the chemical formula, x stands for 0, 1, or 2) to etch both the silicon oxide layer and the silicon nitride layer.

2. The etching method according to claim 1, wherein the unsaturated halon is at least one selected from the group consisting of bromotrifluoroethylene, (E)-1-bromo-2-fluoroethylene, and 1-bromo-1-fluoroethylene.

3. The etching method according to claim 1, wherein the etching gas further contains an inert gas.

4. The etching method according to claim 1, wherein in the etching step, etching is performed with a plasma gas made from the etching gas.

5. A method of manufacturing a semiconductor, comprising performing etching by the etching method as claimed in claim 1.

6. The etching method according to claim 2, wherein the etching gas further contains an inert gas.

7. The etching method according to claim 2, wherein in the etching step, etching is performed with a plasma gas made from the etching gas.

8. The etching method according to claim 3, wherein in the etching step, etching is performed with a plasma gas made from the etching gas.

9. A method of manufacturing a semiconductor, comprising performing etching by the etching method as claimed in claim 2.

10. A method of manufacturing a semiconductor, comprising performing etching by the etching method as claimed in claim 3.

11. A method of manufacturing a semiconductor, comprising performing etching by the etching method as claimed in claim 4.

\* \* \* \* \*